(12) United States Patent
Hoshi et al.

(10) Patent No.: US 11,430,875 B2
(45) Date of Patent: Aug. 30, 2022

(54) METHOD FOR MANUFACTURING TRANSISTOR

(71) Applicant: Nippon Telegraph and Telephone Corporation, Tokyo (JP)

(72) Inventors: Takuya Hoshi, Tokyo (JP); Yuki Yoshiya, Tokyo (JP); Hiroki Sugiyama, Tokyo (JP); Hideaki Matsuzaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 206 days.

(21) Appl. No.: 16/981,603

(22) PCT Filed: Mar. 27, 2019

(86) PCT No.: PCT/JP2019/013184
§ 371 (c)(1),
(2) Date: Sep. 16, 2020

(87) PCT Pub. No.: WO2019/194042
PCT Pub. Date: Oct. 10, 2019

(65) Prior Publication Data
US 2021/0020760 A1 Jan. 21, 2021

(30) Foreign Application Priority Data
Apr. 5, 2018 (JP) .............................. JP2018-072904

(51) Int. Cl.
*H01L 29/66* (2006.01)
*H01L 21/02* (2006.01)
(Continued)

(52) U.S. Cl.
CPC .... *H01L 29/66462* (2013.01); *H01L 21/0254* (2013.01); *H01L 29/2003* (2013.01); *H01L 29/205* (2013.01); *H01L 29/7786* (2013.01)

(58) Field of Classification Search
CPC ................................................ H01L 29/66462
See application file for complete search history.

(56) References Cited

U.S. PATENT DOCUMENTS

| 2009/0072272 | A1  | 3/2009 | Suh et al. |
| 2013/0119404 | A1* | 5/2013 | Saunier, III ....... H01L 29/66431 438/455 |
| 2014/0021481 | A1  | 1/2014 | Lee et al. |

FOREIGN PATENT DOCUMENTS

| JP | 2004342810 A | 12/2004 |
| JP | 2014022752 A | 2/2014 |

(Continued)

OTHER PUBLICATIONS

Chung et al., "N-Face GaN/AIGaN HEMTs Fabricated ThroughLayer Transfer Technology," IEEE Electron Device Letters, vol. 30, No. 2, Feb. 2009, pp. 113-116.

(Continued)

*Primary Examiner* — Grant S Withers
(74) *Attorney, Agent, or Firm* — Slater Matsil, LLP

(57) ABSTRACT

A first barrier layer, a channel layer, a second barrier layer, and a first bonding layer made of high-resistance AlGaN doped with Fe are formed on a first substrate. Thereafter, the first substrate and the second substrate are pasted in a state where the first bonding layer and a second bonding layer made of high-resistance GaN doped with Fe are opposed to each other.

11 Claims, 4 Drawing Sheets

(51) Int. Cl.
*H01L 29/20* (2006.01)
*H01L 29/205* (2006.01)
*H01L 29/778* (2006.01)

(56) References Cited

FOREIGN PATENT DOCUMENTS

JP 2015207771 A 11/2015
JP 2016039327 A 3/2016

OTHER PUBLICATIONS

Wienecke et al., "N-Polar GaN Cap MISHEMT With Record PowerDensity Exceeding 6.5 W/mm at 94 GHz," IEEE Electron Device Letters, vol. 38, No. 3, Mar. 2017, pp. 59-36.
Akasaka et al., "Surface supersaturation in flow-rate modulationepitaxy of GaN," Journal of Crystal Growth, vol. 468, 2017, pp. 821-826.

* cited by examiner

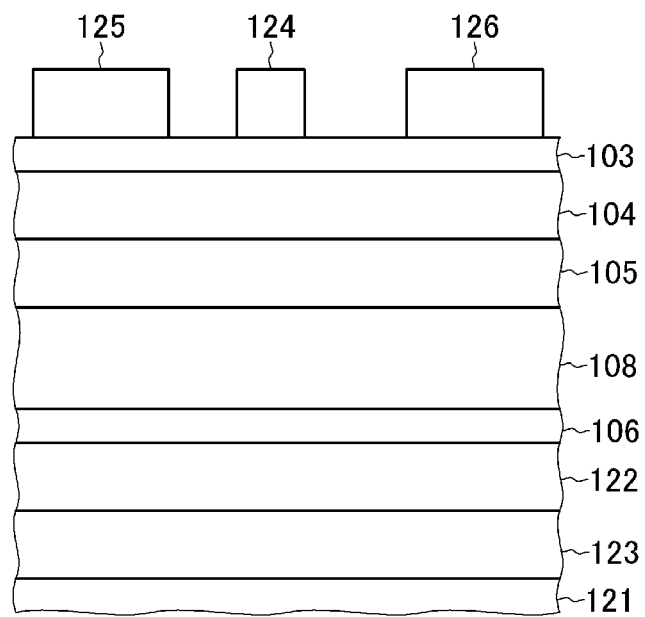

METHOD FOR MANUFACTURING TRANSISTOR

CROSS-REFERENCE TO RELATED APPLICATIONS

This application is a national phase entry of PCT Application No. PCT/JP2019/013184, filed on Mar. 27, 2019, which claims priority to Japanese Application No. 2018-072904, filed on Apr. 5, 2018, which applications are hereby incorporated herein by reference.

TECHNICAL FIELD

The present invention relates to a method of manufacturing a transistor using a nitride semiconductor.

BACKGROUND

A nitride semiconductor such as GaN has a large bandgap and high dielectric breakdown electric field strength. Therefore, an electronic device such as a transistor made of the nitride semiconductor shows a high withstand voltage characteristic. Since the nitride semiconductor has polarization in a c-axis direction, for example, by forming heterojunction of AlGaN and GaN, it is possible to spontaneously form a sheet carrier having high density of approximately $10^{13}$ $cm^{-3}$ according an effect of the polarization.

A GaN-based high electron mobility transistor (HEMT) manufactured using the characteristics explained above has already been put to practical use in an IC application for wireless communication in which a high frequency equal to or higher than several GHz and high power equal to or higher than 200 W are requested. In future, for expansion of a wireless communication capacity, a GaN-based HEMT having a high-frequency characteristic further improved to approximately several ten to several hundred GHz is necessary. For the improvement of the high-frequency characteristic of the HEMT, further scaling of a device is effective.

A basic configuration of an HEMT manufactured using a nitride semiconductor is explained with reference to FIG. 3. In this HEMT, first, a buffer layer 302, a channel layer 303, and a barrier layer 304 formed by epitaxial growth are sequentially stacked on a substrate 301. The channel layer 303 is made of GaN. The barrier layer 304 is made of AlGaN.

The barrier layer 304 and the channel layer 303 are different in the size of polarization. As a result, a sheet carrier (a two-dimensional electron gas) is formed on the channel layer 303 side of an interface between the barrier layer 304 and the channel layer 303. In a semiconductor stacked structure in such a state, a gate electrode 311 is formed on the barrier layer 304 and a source electrode 312 and a drain electrode 313 are formed across the gate electrode 311 by a well-known semiconductor manufacturing process. The gate electrode 311 is connected by so-called Schottky connection. The source electrode 312 and the drain electrode 313 are ohmic-connected to the channel layer 303.

In the HEMT explained above, for device scaling, it is conceivable to reduce a gate length. However, at the same time, the reduction of the gate length causes a so-called short channel effect in which an electric field from a gate less easily works on the channel layer. Accordingly, it is important to reduce a gate-channel distance according to the reduction of the gate length. For the reduction of the gate-channel distance, it is conceivable to further reduce a barrier layer made of AlGaN in thickness.

However, in the case of an HEMT formed by heterojunction of a layer of AlGaN and a layer of GaN, a sheet carrier is formed according to a polarization difference between a barrier layer formed of GaN and a channel layer formed of GaN. Accordingly, if the AlGaN layer is reduced in thickness thoughtlessly, the effect of the polarization weakens and a decrease in sheet carrier density, that is, an increase in resistance is caused. As solutions to this problem, an increase of an Al composition in the AlGaN layer and an increase of a polarization electric field by crystal mixture with In are conceivable. However, deterioration in crystal quality and influence on reliability due to an increase in mixed crystal composition are concerned.

In order to solve the problem due to the reduction in the layer thickness, a technique for controlling polarity of GaN has been reported. Crystal growth and device manufacture are performed for a general GaN-based element in a state of so-called Ga polarity (group III polarity). On the other hand, a technique for performing crystal growth and device manufacturing with an N-polarity (group V polarity) surface set as a principal surface direction is also reported (Non-Patent Literature 1). In this device, the direction of polarization is inverted compared with the device manufactured with Ga polarity in the past. A sheet carrier can be formed in an interface between a GaN channel and an AlGaN barrier (a back barrier layer) by forming an AlGaN barrier layer further on a substrate side than a GaN channel layer.

In such an N-polarity HEMT structure, since a barrier layer is closer to the substrate side than a channel layer, even if a gate length is reduced, a gate-channel distance is fixed. Therefore, it is expected that it is possible to suppress the short channel effect and further expand the high-frequency characteristic than the conventional Ga-polarity device.

As explained above, although the improvement of the high-frequency characteristic is expected in the N-polarity HEMT, the N-polarity HEMT has a problem in that crystal growth is extremely difficult. In general, a heterogeneous substrate of sapphire, SiC, or the like is used for the crystal growth of the nitride semiconductor. However, in order to make a principal surface from an N pole and crystal-grow the nitride semiconductor, a technique for, for example, forming a special buffer layer with surface nitriding treatment for a substrate of sapphire or the like, an off angle or the like of which is controlled in advance, is necessary. Since the influence of characteristics of each crystal growth device and an origin of the substrate is large, an advanced technology is required for introduction of such a special buffer layer. Even if N-polarity GaN is obtained in this way, the crystal growth after this has problems such as polarity inversion from N polarity to Ga polarity halfway in the growth, deterioration in surface flatness, and easy introduction of impurities.

In recent years, a technique for performing N-polarity growth using an N-polarity GaN substrate manufactured with an N-polarity surface set as a principal surface direction has been reported. Even in a system of homoepitaxial growth in which such a special buffer layer is not used, the problems in the crystal growth process explained above remains. An advanced technology is required in order to manufacture an HEMT by a high-quality N-polarity-epitaxially grown nitride semiconductor (Non-Patent Literature 2).

As a technique for solving the problems described above, manufacturing of an HEMT by GaN, a principal surface of which is set to N polarity, by substrate transfer has been reported (Non-Patent Literature 3). In Non-Patent Literature 3, first, in a state in which the principal surface is set to Ga polarity, GaN is epitaxially grown on an Si substrate to form an HEMT structure. Subsequently, these are pasted to a heterogeneous substrate by a predetermined pasting technique via hydrogen silsesquixane (HSQ). Thereafter, the Si substrate is removed, a layer of epitaxially-grown GaN is exposed, and a manufacturing process for an HEMT is implemented to form an HEMT by GaN with the principal surface set to the N polarity.

An advantage of the technique of Non-Patent Literature 3 explained above is that GaN does not grow with N-polarity. The growth of the Ga-polarity GaN has already been technically matured. Therefore, it is relatively easy to manufacture an HEMT structure by AlGaN/GaN in Ga polarity on an Si substrate. The problems in the N-polarity growth explained above do not occur.

CITATION LIST

Non-Patent Literature

Non-Patent Literature 1: S. Wienecke et al., "N-Polar GaN Cap MISHEMT With Record Power Density Exceeding 6.5 W/mm at 94 GHz", IEEE Electron Device Letters, vol. 38, no. 3, pp. 359-362, 2017.

Non-Patent Literature 2: T. Akasaka et al., "Surface supersaturation in flow-rate modulation epitaxy of GaN", Journal of Crystal Growth, vol. 468, pp. 821-826, 2017.

Non-Patent Literature 3: J. W. Chung et al., "N-Face GaN/AlGaN HEMTs Fabricated Through Layer Transfer Technology", IEEE Electron Device Letters, vol. 30, no. 2, pp. 113-116, 2009.

SUMMARY

Technical Problem

Incidentally, for further improvement of the high-frequency characteristic, the HEMT manufactured by the substrate transfer explained above also has a problem. It is an influence of a bonding interface in the substrate transfer. As the substrate transfer, there are, for example, a technique for pasting two wafers to be opposed to each other and bonding the wafers at high temperature and high pressure and so-called surface activation bonding for bonding the wafers in a state in which the surfaces of the wafers are activated by plasma. In both the techniques, the influence on a transistor characteristic is not completely eliminated from the viewpoint of damage to crystal. In the pasting technique explained above, it is likely that an original transistor characteristic cannot be brought out because of introduction of a crystal defect due to the bonding.

For the influence on the device characteristics by the crystal quality of a bonding section due to the pasting explained above, for example, a leak current from a source to a drain is assumed. Ideally, an electric current does not flow between the source and the drain if gate potential is in an OFF state. However, if a large number of defects are introduced into the bonding section, a leak current flows between the source and the drain via these defect levels. In this way, in the conventional technique, there is a problem in that the device characteristic is deteriorated by the crystal defect in the pasted bonding section.

Embodiments of the present invention have been devised in order to solve the problems described above, and an object of embodiments of the present invention is to suppress deterioration in device characteristics due to a crystal defect in a pasted bonding section.

Means for Solving the Problem

A method of manufacturing a transistor according to embodiments of the present invention includes: a first step of forming a buffer layer made of a nitride semiconductor on a first substrate; a second step of crystal-growing a first barrier layer, a channel layer, a second barrier layer, and a first bonding layer made of nitride semiconductor on the buffer layer in this order in a state in which a principal surface is a group III polarity surface; a third step of forming a second bonding layer made of the nitride semiconductor on a second substrate; a fourth step of pasting the first substrate and the second substrate in a state where the first bonding layer and the second bonding layer are opposed to each other; a fifth step of removing a part or all of the buffer layer and the first substrate and forming the second barrier layer, the channel layer, and the first barrier layer on the second substrate in this order in a state in which the principal surface is a group V polarity surface; and a sixth step of forming, after removing the first substrate, a transistor formed by the second barrier layer, the channel layer, and the first barrier layer on the second substrate. The channel layer is made of a material having a bandgap smaller than that of the first barrier layer and the second barrier layer. The channel layer is made of at least one of GaN, InGaN, AlGaN, and InN. The first barrier layer is made of at least one of AlGaN, InAlN, InAlGaN, AlN, and GaN. The second barrier layer is made of at least one of AlGaN, InAlN, InAlGaN, AlN, and GaN. At least one of the first bonding layer and the second bonding layer is made of the nitride semiconductor doped with C, Fe, Zn, or Mg and increased in resistance or converted into a p type.

A method of manufacturing a transistor according to embodiments of the present invention includes: a first step of forming a buffer layer made of a nitride semiconductor on a first substrate; a second step of crystal-growing a first barrier layer, a channel layer, a second barrier layer, and a first bonding layer made of nitride semiconductor on the buffer layer in this order in a state in which a principal surface is a group III polarity surface; a third step of pasting the first substrate and a second substrate in a state where the first bonding layer and a surface of the second substrate are opposed to each other; a fourth step of removing a part or all of the buffer layer and the first substrate and forming the second barrier layer, the channel layer, and the first barrier layer on the second substrate in this order in a state in which the principal surface is a group V polarity surface; and a fifth step of forming, after removing the first substrate, a transistor formed by the second barrier layer, the channel layer, and the first barrier layer on the second substrate. The channel layer is made of a material having a bandgap smaller than that of the first barrier layer and the second barrier layer. The channel layer is made of at least one of GaN, InGaN, AlGaN, and InN. The first barrier layer is made of at least one of AlGaN, InAlN, InAGaN, AlN, and GaN. The second barrier layer is made of at least one of AlGaN, InAlN, InAlGaN, AlN, and GaN. The first bonding layer is made of the nitride semiconductor doped with C, Fe, Zn, or Mg and increased in resistance or converted into a p type.

The method of manufacturing a transistor further includes a sixth step of forming a second bonding layer made of the nitride semiconductor on the second substrate before pasting the first substrate and the second substrate. In the third step, the first substrate and the second substrate may be pasted in a state where the first bonding layer and the second bonding layer are opposed to each other. The second bonding layer may be made of the nitride semiconductor doped with C, Fe, Zn, or Mg and increased in resistance or converted into a p type.

Effects of Embodiments of the Invention

As explained above, according to embodiments of the present invention, an HEMT by GaN with a principal surface set to N polarity is manufactured by substrate transfer by pasting via the first bonding layer made of the nitride semiconductor doped with C, Fe, Zn, or Mg and increased in resistance or converted into the p type. Therefore, an excellent effect that it is possible to suppress deterioration in device characteristics due to a crystal defect in a pasted bonding section is obtained.

BRIEF DESCRIPTION OF THE DRAWINGS

FIG. 1D is a sectional view showing a state of a halfway process for explaining the method of manufacturing a transistor in the first embodiment of the present invention.

FIG. 1E is a sectional view showing a state of a halfway process for explaining the method of manufacturing a transistor in the first embodiment of the present invention.

DETAILED DESCRIPTION OF ILLUSTRATIVE EMBODIMENTS

Methods of manufacturing a transistor in embodiments of the present invention are explained below.

First Embodiment

First, a method of manufacturing a transistor in a first embodiment of the present invention is explained with reference to FIG. 1A to FIG. 1E.

Figure 1A:
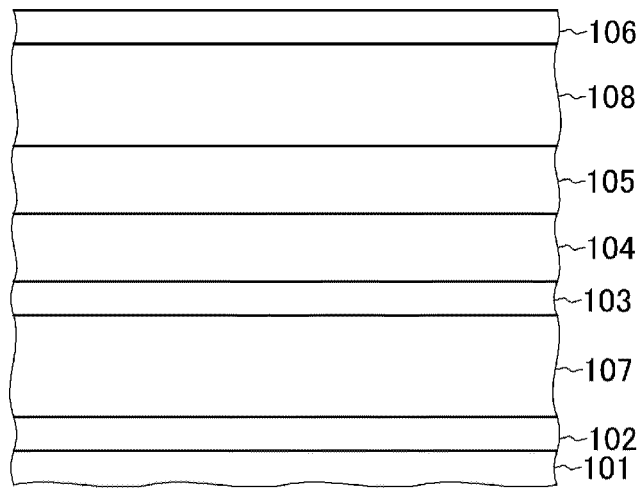
FIG. 1A is a sectional view showing a state of a halfway process for explaining a method of manufacturing a transistor in a first embodiment of the present invention.

First, as shown in FIG. 1A, a buffer layer 102 made of a nitride semiconductor is formed on a first substrate 101 (a first step). Subsequently, a first barrier layer 103, a channel layer 104, a second barrier layer 105, and a first bonding layer 106 made of the nitride semiconductor are crystal-grown on the buffer layer 102 in this order in a state in which a principal surface is a group III polarity surface (a second step). In the first embodiment, a release sacrificial layer 107 is formed on the buffer layer 102 and the first barrier layer 103 is formed on the release sacrificial layer 107. A composition graded layer 108 is formed on the second barrier layer 105 and the first bonding layer 106 is formed on the composition graded layer 108. The composition graded layer 108 is formed in contact with the second barrier layer 105 and the first bonding layer 106. The layers may be formed by a well-known organic metal vapor phase growth method.

The first substrate 101 is made of, for example, $Al_2O_3$. Note that the first substrate 101 may be made of SiC, single crystal Si, or the like and only has to be made of a material that can be used for growth of the nitride semiconductor such as GaN. The buffer layer 102 may be made of GaN. A low-temperature growth GaN buffer layer for performing so-called initial nucleus formation may be used as the buffer layer 102. Alternatively, the buffer layer 102 may be made of AlN.

The release sacrificial layer 107 may be made of GaN. The first barrier layer 103 may be made of AlGaN. The channel layer 104 may be made of GaN. The second barrier layer 105 may be made of AlGaN. In this case, Al compositions and thicknesses of the first barrier layer 103 and the second barrier layer 105 only have to be set as appropriate according to an application region of a transistor.

Note that it is important that the first barrier layer 103 and the second barrier layer 105 are made of a material having a bandgap larger than a bandgap of the channel layer 104. The first barrier layer 103 and the second barrier layer 105 are not limited to AlGaN and may be made of AlN, AlInN, or AlInGaN. The first barrier layer 103 and the second barrier layer 105 only have to be made of at least one of AlGaN, InAlN, InAGaN, AlN, and GaN.

The channel layer 104 may be made of, for example, undoped GaN. The channel layer 104 may be a composite channel formed by a stacked structure of InGaN, InN, and the like. The channel layer 104 only has to be made of at least one of GaN, InGaN, AlGaN, and InN.

The composition graded layer 108 is made of, for example, AlGaN. The composition graded layer 108 is designed to gradually change an Al composition of AlGaN from a high state to a low state from the second barrier layer 105 side. High-resistance AlGaN doped with iron (Fe) is grown to form the first bonding layer 106 on the composition graded layer 108 configured in this way. In this configuration, an Al composition of the first bonding layer 106 is set smaller than an Al composition of the composition graded layer 108 by AlGaN.

Note that the first bonding layer 106 may be made of GaN doped with Fe. Note that it is important that the first bonding layer 106 is formed as a high-resistance layer. Accordingly, in the first bonding layer 106, doping is not limited to Fe and may be, for example, zinc (Zn) or carbon (C). For the purpose of cancelling a leak current, the first bonding layer 106 may be made of a p-type nitride semiconductor in which magnesium (Mg) or the like is used as a dopant.

In the first barrier layer 103, the channel layer 104, the second barrier layer 105, and the first bonding layer 106, a state of group III polarity is easily obtained by a growth method in which a general GaN buffer layer is used. It is easy to crystal-grow the first barrier layer 103, the channel layer 104, the second barrier layer 105, and the first bonding layer 106 in a state in which the principal surface is a group III polarity surface.

Incidentally, mixing due to impurity diffusion to an epitaxial growth layer during crystal growth sometimes occurs concerning Fe and Zn. Influence due to a memory effect in a growth furnace sometime occurs concerning Mg. In the case of C dope, unlike a normal epitaxial growth condition, a growth condition in which C is easily mixed but crystal quality is easily deteriorated is sometimes used. However, since the first bonding layer 106 is formed as a top layer, influence on the first barrier layer 103, the channel layer 104, and the second barrier layer 105 under the first bonding layer 106 can be suppressed. These layers are important in characteristics of an HEMT. According to the embodiment, it is possible to form the high-resistance first bonding layer 106 for leak current suppression while maintaining high crystal quality in these layers.

Figure 1B:
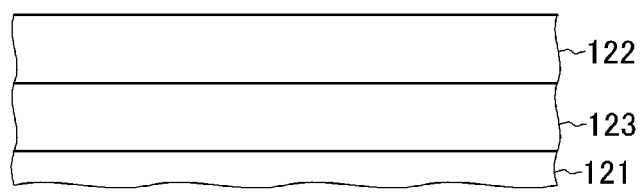
FIG. 1B is a sectional view showing a state of a halfway process for explaining the method of manufacturing a transistor in the first embodiment of the present invention.

Subsequently, as shown in FIG. 1B, a second bonding layer 122 made of the nitride semiconductor is formed on a second substrate 121 (a third step). In the first embodiment, the second bonding layer 122 is formed on the second substrate 121 via a buffer layer 123. For example, the buffer layer 123 and the second bonding layer 122 may be sequentially crystal-grown on the second substrate 121 by the well-known organic metal vapor phase growth method.

The second substrate 121 only has to be made of a material that can be used for growth of the nitride semiconductor such as GaN. For example, the second substrate 121 may be made of SiC excellent in a heat radiation characteristic assuming application to a high-frequency device. The buffer layer 123 may be made of a nitride semiconductor containing Al such as AlN or AlGaN.

The second bonding layer 122 may be made of, for example, GaN doped with Fe. Note that, in this case, as the above, since the second bonding layer 122 doped with Fe is formed in a top layer, influence due to impurity introduction on the layers under the second bonding layer 122 is small.

Figure 1C:
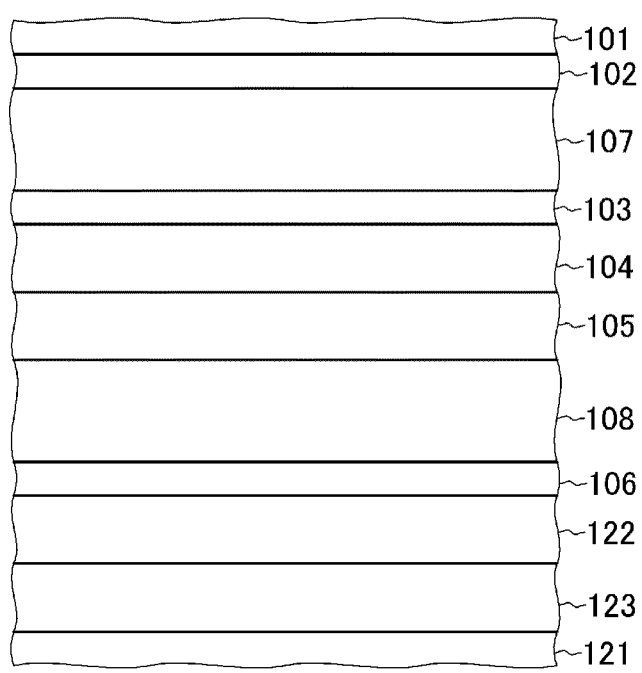
FIG. 1C is a sectional view showing a state of a halfway process for explaining the method of manufacturing a transistor in the first embodiment of the present invention.

Subsequently, as shown in FIG. 1C, the first substrate 101 and the second substrate 121 are pasted in a state where the first bonding layer 106 and the second bonding layer 122 are opposed to each other (a fourth step). The top layer grown on the first substrate 101 and the top layer grown on the second substrate 121 are brought into contact and pasted.

For the pasting, a well-known wafer bonding method may be used. As the wafer bonding, a technique by direct bonding is desirable. For example, a technique such as surface activation bonding for irradiating plasma on the first substrate 101 and the second substrate 121 to change the first substrate 101 and the second substrate 121 to a surface active state and applying pressure to the first substrate 101 and the second substrate 121 to bond the first substrate 101 and the second substrate 121 at normal temperature or under heating of approximately several hundred degrees is used. If the influence of heat treatment can be eliminated, a technique for applying high pressure between the first substrate 101 and the second substrate 121 and heating the first substrate 101 and the second substrate 121 to high temperature to thereby bond the first substrate 101 and the second substrate 121 may be used. Note that, on both the substrates, what is damaged by the wafer bonding is the bonding layers doped with Fe and increased in resistance. It is possible to substantially eliminate influence on the first barrier layer 103, the channel layer 104, the second barrier layer 105, and the like other than the bonding layers.

In order to perform the direct bonding explained above, high flatness of pasting surfaces is requested. For example, in surface activation bonding of GaN layers, flatness of approximately 1 nm or less in root mean square roughness is necessary as surface flatness observed by an atomic force microscope or the like. In order to obtain such high flatness, the surface of the first bonding layer 106 and the surface of the second bonding layer 122, which are pasting surfaces, may be flattened by chemical mechanical polishing (CMP) before being bonded. Damage to the first bonding layer 106 and the second bonding layer 122 is caused by such flattening. However, according to the embodiment, since the layers to be flattened are increased in resistance, as explained above, influence on a transistor characteristic due to damage to crystal can be reduced.

Subsequently, a part or all of the buffer layer 102 and the first substrate 101 are removed. As shown in FIG. 1D, the second barrier layer 105, the channel layer 104, and the first barrier layer 103 are formed on the second substrate 121 in this order in a state in which the principal surface is a group V polarity surface (a fifth step).

For example, it is possible to peel the first substrate 101 using a publicly-known technique such as laser lift-off. The first substrate 101 can be removed by forming the buffer layer 102 in a hetero structure of GaN/AlGaN, removing the first substrate 101 to a certain degree with a grinding and polishing technique such as CMP, and thereafter using selective etching of GaN/AlGaN. Alternatively, the first substrate 101 may be made of Si, and the first substrate 101 may be removed using a selective etching characteristic with the buffer layer 102 made of GaN.

After removing the first substrate 101 to expose the buffer layer 102 and the release sacrificial layer 107, the buffer layer 102 and the release sacrificial layer 107 may be polished and flattened by CMP. The first barrier layer 103 may be exposed using the selective etching.

Subsequently, after the first substrate 101 is removed, a transistor formed by the second barrier layer 105, the channel layer 104, and the first barrier layer 103 is formed on the second substrate 121 (a sixth step). For example, as shown in FIG. 1E, a gate electrode 124 is formed on the first barrier layer 103. A source electrode 125 and a drain electrode 126 are formed thereon across the gate electrode 124. The gate electrode 124 is connected by so-called Schottky connection. The source electrode 125 and the drain electrode 126 are ohmic-connected to the channel layer 104.

For example, a mask including openings in parts where the source electrode 125 and the drain electrode 126 are formed is formed by publicly-known photolithography. Thereafter, metal to be used as an electrode material is deposited in the openings of the mask. In general, the metal only has to be a material that can form ohmic contact with the channel layer 104. A stacked structure such as Ti/Al/Ni/Au is generally used for the metal, for example. These kinds of metal are formed by a technique such as a sputter method or a high-vacuum electron beam vapor deposition method. For the ohmic contact formation, after the metal is deposited, an alloy layer of the metal and a compound semiconductor is formed by high-temperature heating treatment at 800° C. or more in atmosphere of a nitrogen gas. Thereafter, the gate electrode 124 is formed. The gate electrode 124 only has to be made of metal that forms Schottky contact with the first barrier layer 103. An insulating film or the like having a high dielectric constant may be formed as a gate insulating film in advance between the gate electrode 124 and the first barrier layer 103.

According to the first embodiment explained above, the first barrier layer 103, the channel layer 104, and the second barrier layer 105 grown on the second substrate 121 with the principal surface as the group III polarity surface are transferred onto the second substrate 121, whereby the first barrier layer 103, the channel layer 104, and the second barrier layer 105 are stacked on the second substrate 121 with the principal surface as a group V polarity surface. In other words, the second barrier layer 105, the channel layer 104, and the first barrier layer 103 stacked on the second substrate 121 are in a state in which the principal surface is the group V polarity surface.

The pasted first bonding layer 106 and the pasted second bonding layer 122 are doped with Fe. Accordingly, in these layers, a carrier is trapped in a deep level in a bandgap of a semiconductor. The layers are in a state having an effect of suppressing electric conduction and increasing resistance. Therefore, according to the first embodiment, it is possible to suppress influence on a transistor characteristic by a crystal defect caused by pasting.

Incidentally, usually, these high-resistance layers are introduced into a side closer to a substrate than a channel layer when being formed by epitaxial growth. However, a dopant such as Fe or Zn is a material that are easily diffused to a region of an upper layer than a doped layer in epitaxial growth. In manufacturing of an HEMT in which normal transfer is not performed, attention is required in the epitaxial growth. However, according to the embodiment, since an Fe-doped layer is grown as a layer formed last, it is possible to reduce diffusion of Fe or Zn to a region under the Fe-doped layer as much as possible.

Note that, in the first embodiment explained above, the first bonding layer 106 and the second bonding layer 122 are the high-resistance layers but are not limited to this. At least one of the first bonding layer 106 and the second bonding layer 122 only has to be made of the nitride semiconductor doped with C, Fe, Zn, or Mg and increased in resistance or converted into a p type. For example, the first bonding layer 106 may be made of undoped GaN. The second bonding layer 122 may be made of GaN doped with Fe.

Second Embodiment

A method of manufacturing a transistor in a second embodiment of the present invention is explained with reference to FIG. 2A to FIG. 2D.

Figure 2A:
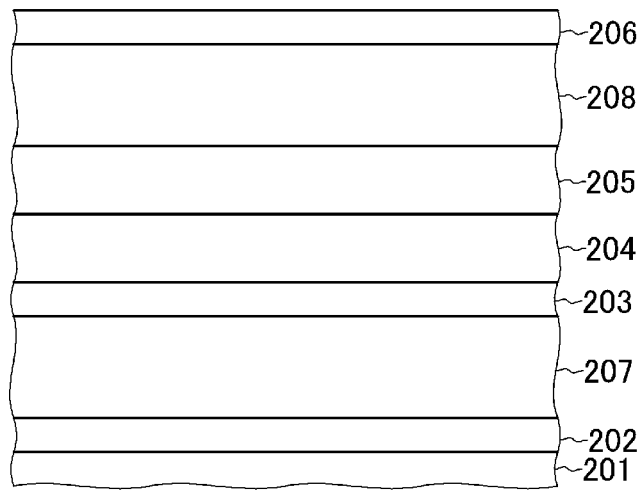
FIG. 2A is a sectional view showing a state of a halfway process for explaining a method of manufacturing a transistor in a second embodiment of the present invention.

First, as shown in FIG. 2A, a buffer layer 202 made of a nitride semiconductor is formed on a first substrate 201 (a first step). Subsequently, a first barrier layer 203, a channel layer 204, a second barrier layer 205, and a first bonding layer 206 made of the nitride semiconductor are crystal-grown on the buffer layer 202 in this order in a state in which a principal surface is a group III polarity surface (a second step). In the second embodiment, a release sacrificial layer 207 is formed on the buffer layer 202. The first barrier layer 203 is formed on the release sacrificial layer 207. A composition graded layer 208 is formed on the second barrier layer 205. The first bonding layer 206 is formed on the composition graded layer 208. The composition graded layer 208 is formed in contact with the second barrier layer 205 and the first bonding layer 206. The layers may be formed by a well-known organic metal vapor phase growth method.

The first substrate 201 is made of, for example, $Al_2O_3$. Note that the first substrate 201 may be made of SiC, single crystal Si, or the like and only has to be made of a material that can be used for growth of the nitride semiconductor such as GaN. The buffer layer 202 may be made of GaN. A low-temperature growth GaN buffer layer for performing so-called initial nucleus formation has may be used as the buffer layer 202. Alternatively, the buffer layer 202 may be made of AlN.

The release sacrificial layer 207 may be made of GaN. The first barrier layer 203 may be made of AlGaN. The channel layer 204 may be made of GaN. The second barrier layer 205 may be made of AlGaN. In this case, Al compositions and thicknesses of the first barrier layer 203 and the second barrier layer 205 only have to be set as appropriate according to an application region of a transistor.

Note that it is important that the first barrier layer 203 and the second barrier layer 205 are made of a material having a bandgap larger than a bandgap of the channel layer 204. The first barrier layer 203 and the second barrier layer 205 are not limited to AlGaN and may be made of AlN, AlInN, or AlInGaN. The first barrier layer 203 and the second barrier layer 205 only have to be made of at least one of AlGaN, InAlN, InAGaN, AlN, and GaN.

The channel layer 204 may be made of, for example, undoped GaN. The channel layer 204 may be a composite channel formed by a stacked structure of InGaN, InN, and the like. The channel layer 204 only has to be made of at least one of GaN, InGaN, AlGaN, and InN.

The composition graded layer 208 is made of, for example, AlGaN. The composition graded layer 208 is designed to gradually change an Al composition of AlGaN from a high state to a low state from the second barrier layer 205 side. High-resistance AlGaN doped with iron (Fe) is grown to form the first bonding layer 206 on the composition graded layer 208 configured in this way. In this configuration, an Al composition of the first bonding layer 206 is set smaller than an Al composition of the composition graded layer 208 by AlGaN.

Note that the first bonding layer 206 may be made of GaN doped with Fe. Note that it is important that the first bonding layer 260 is formed as a high-resistance layer. Accordingly, in the first bonding layer 206, doping is not limited to Fe and may be, for example, zinc (Zn) or carbon (C). For the purpose of cancelling a leak current, the first bonding layer 206 may be made of a p-type nitride semiconductor in which magnesium (Mg) or the like is used as a dopant.

In the first barrier layer 203, the channel layer 204, the second barrier layer 205, and the first bonding layer 206, a state of group III polarity is easily obtained by a growth method in which a general GaN buffer layer is used. It is easy to crystal-grow the first barrier layer 203, the channel layer 204, the second barrier layer 205, and the first bonding layer 206 in a state in which the principal surface is a group III polarity surface. Note that the configuration explained above is the same as the configuration in the first embodiment.

Incidentally, mixing due to impurity diffusion to an epitaxial growth layer during crystal growth sometimes occurs concerning Fe and Zn. Influence due to a memory effect in a growth furnace sometime occurs concerning Mg. In the case of C dope, unlike a normal epitaxial growth condition, a growth condition in which C is easily mixed but crystal quality is easily deteriorated is sometimes used. However, since the first bonding layer 206 is formed as a top layer, influence on the first barrier layer 203, the channel layer 204, and the second barrier layer 205 under the first bonding layer 206 can be suppressed. These layers are important in characteristics of an HEMT. According to the embodiment, it is possible to form the high-resistance first bonding layer 206 for leak current suppression while maintaining high crystal quality in these layers.

Figure 2B:
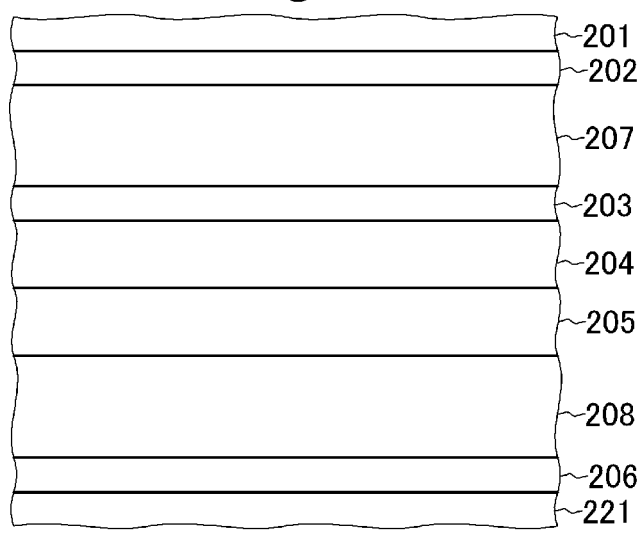
FIG. 2B is a sectional view showing a state of a halfway process for explaining the method of manufacturing a transistor in the second embodiment of the present invention.

Subsequently, as shown in FIG. 2B, the first substrate 201 and a second substrate 221 are pasted in a state where the first bonding layer 206 and a surface of the second substrate 221 are opposed to each other (a third step). The second substrate 221 only has to be made of a material that can be used for growth of the nitride semiconductor such as GaN. For example, the second substrate 221 may be made of SiC excellent in a heat radiation characteristic assuming application to a high-frequency device. The buffer layer 123 may be made of a nitride semiconductor containing Al such as AlN or AlGaN.

For the pasting, a well-known wafer bonding method may be used. As the wafer bonding, a technique by direct bonding is desirable. For example, a technique such as surface activation bonding for irradiating plasma on the first substrate 201 and the second substrate 221 to change the first substrate 201 and the second substrate 221 to a surface active state and applying pressure to the first substrate 201 and the second substrate 221 to bond the first substrate 201 and the second substrate 221 at normal temperature or under heating of approximately several hundred degrees is used. If the influence of heat treatment can be eliminated, a technique for applying high pressure between the first substrate 201 and the second substrate 221 and heating the first substrate 201 and the second substrate 221 to high temperature to thereby bond the first substrate 201 and the second substrate 221 may be used. Note that, what is damaged by the wafer bonding is the first bonding layer 206 doped with Fe and increased in resistance. It is possible to substantially eliminate influence on the first barrier layer 203, the channel layer 204, the second barrier layer 205, and the like other than the first bonding layer 206.

In order to perform the direct bonding explained above, high flatness of pasting surfaces is requested. For example, in surface activation bonding of a GaN layer and an SiC substrate, flatness of approximately 1 nm or less in root mean square roughness is necessary as surface flatness observed by an atomic force microscope or the like. In order to obtain such high flatness, the surface of the first bonding layer 206 and the surface of the second substrate 221, which are pasting surfaces, may be flattened by chemical mechanical polishing (CMP) before being bonded. Damage to the first bonding layer 206 is caused by such flattening. However, according to the embodiment, since the first bonding layer 206 is increased in resistance, as explained above, influence on a transistor characteristic due to damage to crystal can be reduced.

Figure 2C:
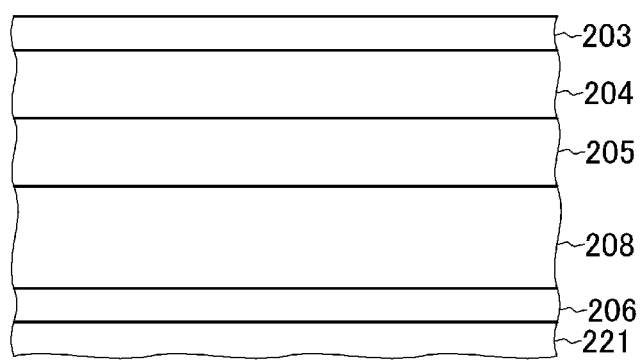
FIG. 2C is a sectional view showing a state of a halfway process for explaining the method of manufacturing a transistor in the second embodiment of the present invention.
Figure 2D:
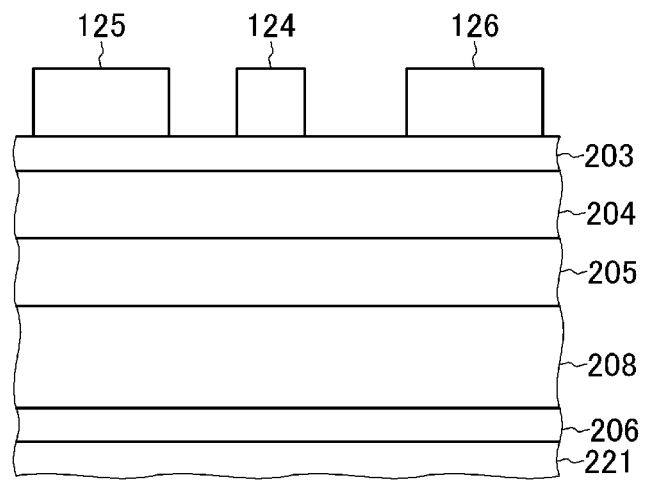
FIG. 2D is a sectional view showing a state of a halfway process for explaining the method of manufacturing a transistor in the second embodiment of the present invention.
Figure 3:
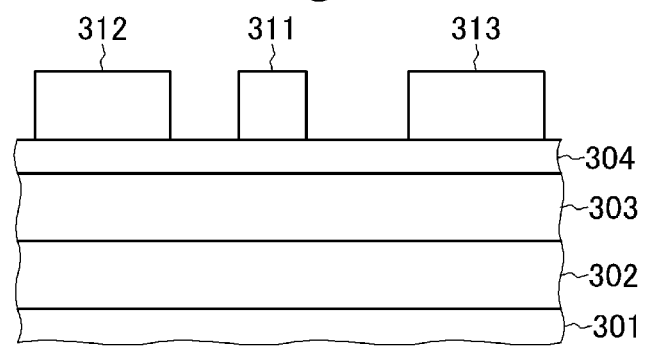
FIG. 3 is a sectional view showing the configuration of a high electron mobility transistor.

Subsequently, a part or all of the buffer layer 202 and the first substrate 201 are removed. As shown in FIG. 2C, the second barrier layer 205, the channel layer 204, and the first barrier layer 203 are formed on the second substrate 221 in this order in a state in which the principal surface is a group V polarity surface (a fourth step).

For example, it is possible to peel the first substrate 201 using a publicly-known technique such as laser lift-off. The substrate 1 can be removed by forming the buffer layer 202 in a hetero structure of GaN/AlGaN, removing the first substrate 201 to a certain degree with a grinding and polishing technique such as CMP, and thereafter using selective etching of GaN/AlGaN. Alternatively, the first substrate 201 may be made of Si, and the first substrate 201 may be removed using a selective etching characteristic with the buffer layer 202 made of GaN.

After removing the first substrate 201 to expose the buffer layer 202 and the release sacrificial layer 207, the buffer layer 202 and the release sacrificial layer 207 may be polished and flattened by CMP. The first barrier layer 203 may be exposed using the selective etching.

Subsequently, after the first substrate 201 is removed, a transistor formed by the second barrier layer 205, the channel layer 204, and the first barrier layer 203 is formed on the second substrate 221 (a fifth step). For example, as shown in FIG. 2E, the gate electrode 124 is formed on the first barrier layer 203. The source electrode 125 and the drain electrode 126 are formed across the gate electrode 124. The gate electrode 124 is connected by so-called Schottky connection. The source electrode 125 and the drain electrode 126 are ohmic-connected to the channel layer 204.

For example, a mask including openings in parts where the source electrode 125 and the drain electrode 126 are formed is formed by publicly-known photolithography. Thereafter, metal to be used as an electrode material is deposited in the openings of the mask. In general, the metal only has to be a material that can form ohmic contact with the channel layer 204. A stacked structure such as Ti/Al/Ni/Au is generally used for the metal, for example. These kinds of metal are formed by a technique such as a sputter method or a high-vacuum electron beam vapor deposition method. For the ohmic contact formation, after the metal is deposited, an alloy layer of the metal and a compound semiconductor is formed by high-temperature heating treatment at 800° C. or more in atmosphere of a nitrogen gas. Thereafter, the gate electrode 124 is formed. The gate electrode 124 only has to be made of metal that forms Schottky contact with the first barrier layer 203. An insulating film or the like having a high dielectric constant may be formed as a gate insulating film in advance between the gate electrode 124 and the first barrier layer 203.

According to the second embodiment explained above, the first barrier layer 203, the channel layer 204, and the second barrier layer 205 grown on the second substrate 221 with the principal surface as the group III polarity surface are transferred onto the second substrate 221, whereby the first barrier layer 203, the channel layer 204, and the second barrier layer 205 are stacked on the second substrate 221 with the principal surface as a group V polarity surface. In other words, the second barrier layer 205, the channel layer 204, and the first barrier layer 203 stacked on the second substrate 221 are in a state in which the principal surface is the group V polarity surface.

The pasted first bonding layer 206 is doped with Fe. Accordingly, in the first bonding layer 206, a carrier is trapped in a deep level in a bandgap of a semiconductor. The first bonding layer 206 is in a state having an effect of suppressing electric conduction and increasing resistance. Therefore, according to the second embodiment, it is possible to suppress influence on a transistor characteristic by a crystal defect caused by pasting.

Incidentally, usually, the high-resistance layers explained above are introduced into a side closer to a substrate than a channel layer when being formed by epitaxial growth. However, a dopant such as Fe or Zn is a material that are easily diffused to a region of an upper layer than a doped layer in epitaxial growth. In manufacturing of an HEMT in which normal transfer is not performed, attention is required in the epitaxial growth. However, according to the embodiment, since an Fe-doped layer is grown as a layer formed last, it is possible to reduce diffusion of Fe or Zn to a region under the Fe-doped layer as much as possible.

Note that, in the second embodiment explained above, the first bonding layer 206 is the high-resistance layer and the second substrate 221 is bonded to the first bonding layer 206. However, the embodiment is not limited to this. For example, a second bonding layer made of the nitride semiconductor may be formed on the second substrate 221 (a sixth step) and the second bonding layer and the first bonding layer 206 may be bonded to be opposed to each other to paste the first substrate 201 and the second substrate 221 (the third step). The second bonding layer may also be made of the nitride semiconductor doped with C, Fe, Zn, or Mg and increased in resistance or converted into a p type.

As explained above, in embodiments of the present invention, an HEMT by GaN with a principal surface set to N polarity is manufactured by substrate transfer by pasting via the first bonding layer made of the nitride semiconductor doped with C, Fe, Zn, or Mg and increased in resistance or converted into the p type. Therefore, it is possible to suppress deterioration in device characteristics due to a crystal defect in a pasted bonding section.

Note that the present invention is not limited to the embodiments explained above. It is evident that many modifications and combinations can be implemented by those having ordinary knowledge in the field within the technical idea of the present invention.

REFERENCE SIGNS LIST

101 first substrate
102 buffer layer
103 first barrier layer
104 channel layer
105 second barrier layer
106 first bonding layer.

The invention claimed is:

1. A method of manufacturing a transistor comprising:
   forming a buffer layer of a nitride semiconductor on a first substrate;
   forming a first material stack, wherein forming the first material stack comprises crystal-growing a first barrier layer, a channel layer, a second barrier layer, and a first bonding layer on the buffer layer in this order, and wherein a principal surface of the first material stack is a group III polarity surface, the first bonding layer comprises the nitride semiconductor;
   forming a second bonding layer on a second substrate, the second bonding layer comprises the nitride semiconductor;
   pasting the first substrate to the second substrate such that the first bonding layer faces the second bonding layer; and
   at least partially removing the buffer layer and the first substrate to form a second material stack, the second material stack comprises the second barrier layer, the channel layer, and the first barrier layer on the second substrate in this order, and wherein a principal surface of the second material stack is a group V polarity surface, wherein after removing the first substrate, a transistor is formed by the second barrier layer, the channel layer, and the first barrier layer on the second substrate.

2. The method of manufacturing a transistor according to claim 1, wherein the channel layer is made of a material having a bandgap smaller than a bandgap of the first barrier layer and a bandgap of the second barrier layer.

3. The method of manufacturing a transistor according to claim 1, wherein the channel layer comprises GaN, InGaN, AlGaN, or InN.

4. The method of manufacturing a transistor according to claim 1, wherein the first barrier layer comprises AlGaN, InAlN, InAlGaN, AlN, or GaN.

5. The method of manufacturing a transistor according to claim 1, wherein the second barrier layer comprises AlGaN, InAlN, InAlGaN, AlN, or GaN.

6. The method of manufacturing a transistor according to claim 1, wherein the first bonding layer or the second bonding layer is doped with C, Fe, Zn, or Mg.

7. The method of manufacturing a transistor according to claim 1, wherein the first bonding layer or the second bonding layer is increased in resistance or converted into a p type.

8. A method of manufacturing a transistor comprising:
   forming a buffer layer made of a nitride semiconductor on a first substrate;
   forming a first material stack, wherein forming the first material stack comprises crystal-growing a first barrier layer, a channel layer, a second barrier layer, and a first bonding layer on the buffer layer in this order, and wherein a principal surface of the first material stack is a group III polarity surface, the first bonding layer comprises the nitride semiconductor;
   pasting the first substrate to a second substrate such that the first bonding layer and a surface of the second substrate face each other; and
   at least partially removing the buffer layer and the first substrate to form a second material stack, the second material stack comprising the second barrier layer, the channel layer, and the first barrier layer on the second substrate in this order, wherein a principal surface of the second material stack is a group V polarity surface;
   wherein after removing the first substrate, a transistor is formed by the second barrier layer, the channel layer, and the first barrier layer on the second substrate;
   wherein the channel layer has a bandgap smaller than a bandgap of the first barrier layer and a bandgap of the second barrier layer;
   wherein the channel layer is made of GaN, InGaN, AlGaN, or InN;
   wherein the first barrier layer is made of AlGaN, InAlN, InAlGaN, AlN, or GaN;
   wherein the second barrier layer is made of AlGaN, InAlN, InAlGaN, AlN, or GaN;
   wherein the first bonding layer is doped with C, Fe, Zn, or Mg; and
   wherein the first bonding layer is increased in resistance or converted into a p type.

9. The method of manufacturing a transistor according to claim 8, further comprising:
   forming a second bonding layer made of the nitride semiconductor on the second substrate before pasting the first substrate and the second substrate, wherein the first substrate and the second substrate are pasted in a state where the first bonding layer and the second bonding layer face each other.

10. The method of manufacturing a transistor according to claim 9, wherein the second bonding layer is made of the nitride semiconductor and is doped with C, Fe, Zn, or Mg, and wherein the second bonding layer is increased in resistance or converted into a p type.

11. A method of manufacturing a transistor comprising:
   forming a buffer layer of a nitride semiconductor on a first substrate;
   forming a first material stack, wherein forming the first material stack comprises crystal-growing a first barrier layer, a channel layer, a second barrier layer, and a first bonding layer on the buffer layer in this order, and wherein a principal surface of the first material stack is a group III polarity surface, the first bonding layer comprises the nitride semiconductor;
   forming a second bonding layer on a second substrate, the second bonding layer comprises the nitride semiconductor;

pasting the first substrate to the second substrate such that the first bonding layer faces the second bonding layer; and at least partially removing the buffer layer and the first substrate to form a second material stack, the second material stack comprises the second barrier layer, the channel layer, and the first barrier layer on the second substrate in this order, and wherein a principal surface of the second material stack is a group V polarity surface;

wherein after removing the first substrate, a transistor is formed by the second barrier layer, the channel layer, and the first barrier layer on the second substrate;

wherein the channel layer is made of a material having a bandgap smaller than a bandgap of the first barrier layer and a bandgap of the second barrier layer;

wherein the channel layer comprises GaN, InGaN, AlGaN, or InN;

wherein the first barrier layer comprises AlGaN, InAlN, InAlGaN, AlN, or GaN;

wherein the second barrier layer comprises AlGaN, InAlN, InAlGaN, AlN, or GaN;

wherein the first bonding layer or the second bonding layer is doped with C, Fe, Zn, or Mg; and wherein the first bonding layer or the second bonding layer is increased in resistance or converted into a p type.

* * * * *